US010473709B2

(12) United States Patent
Sarafianos et al.

(10) Patent No.: US 10,473,709 B2
(45) Date of Patent: Nov. 12, 2019

(54) INTEGRATED CIRCUIT CHIP STACK

(71) Applicant: STMicroelectronics (Rousset) SAS, Rousset (FR)

(72) Inventors: Alexandre Sarafianos, Pourrieres (FR); Thomas Ordas, Pourcieux (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 16/125,096

(22) Filed: Sep. 7, 2018

(65) Prior Publication Data
US 2019/0079133 A1    Mar. 14, 2019

(30) Foreign Application Priority Data

Sep. 11, 2017    (FR) ..................... 17 58340

(51) Int. Cl.
*H01L 23/00* (2006.01)
*G01R 31/12* (2006.01)
(Continued)

(52) U.S. Cl.
CPC ... *G01R 31/1272* (2013.01); *G01R 31/31719* (2013.01); *G06K 19/073* (2013.01); *H01L 23/5386* (2013.01); *H01L 23/5388* (2013.01); *H01L 23/573* (2013.01); *H01L 23/576* (2013.01); *H01L 25/0657* (2013.01); *H01L 2225/06513* (2013.01); *H01L 2225/06527* (2013.01); *H01L 2225/06537* (2013.01); *H01L 2225/06541* (2013.01)

(58) Field of Classification Search
None
See application file for complete search history.

(56) References Cited

U.S. PATENT DOCUMENTS 7,498,644 B2 * 3/2009 Shapiro ............... H01L 27/1446
257/428
9,012,911 B2 * 4/2015 Wuidart ............... H01L 23/576
257/48

(Continued)

FOREIGN PATENT DOCUMENTS

| EP | 1273997 A2 | 1/2003 |
|---|---|---|
| WO | 2009035688 A1 | 3/2009 |
| WO | 2015000813 A1 | 1/2015 |

OTHER PUBLICATIONS

INPI Search Report and Written Opinion for FR 1758340 dated Jul. 18, 2018 (9 pages).

*Primary Examiner* — Chandra Chaudhari
(74) *Attorney, Agent, or Firm* — Crowe & Dunlevy

(57) ABSTRACT

An integrated circuit chip stack includes a main integrated circuit chip and at least one auxiliary integrated circuit chip. The main integrated circuit chip contains circuit components to be protected. The auxiliary integrated circuit chip is mounted to a surface of the main integrated circuit chip and includes a metal plane connected to ground located opposite the circuit components to be protected. The auxiliary integrated circuit chip further includes at least one insulated conductive track forming a tight pattern opposite the circuit components to be protected. A detection circuit is connected to the at least one conductive track and is configured to detect interruption of the at least one insulated conductive track.

17 Claims, 2 Drawing Sheets

(51) Int. Cl.
    *G06K 19/073*     (2006.01)
    *H01L 25/065*     (2006.01)
    *G01R 31/317*     (2006.01)
    *H01L 23/538*     (2006.01)

(56) References Cited

U.S. PATENT DOCUMENTS

| | | |
|---|---|---|
| 10,236,262 B2 * | 3/2019 | Guilley .............. H01L 23/5225 |
| 2003/0008432 A1 | 1/2003 | Kux et al. |
| 2006/0180939 A1 | 8/2006 | Matsuno |
| 2010/0213590 A1 | 8/2010 | Warren et al. |

* cited by examiner ly, only those
INTEGRATED CIRCUIT CHIP STACK

PRIORITY CLAIM

This application claims the priority benefit of French Application for Patent No. 1758340, filed on Sep. 11, 2017, the content of which is hereby incorporated by reference in its entirety to the maximum extent allowable by law.

TECHNICAL FIELD

The present disclosure relates to the field of electronic integrated circuit chips and more particularly aims at an integrated circuit chip stack comprising an integrated circuit chip protected against pirate attacks.

BACKGROUND

Certain electronic integrated circuit chips, such as bank card integrated circuit chips, may contain confidential data which may be coveted by pirates. Such confidential data may be contained in circuits located on the front surface side of the integrated circuit chip. To obtain the data, a pirate may carry out an attack from the back side or the front side of the integrated circuit chip.

In a type of attack, called etch attack, the pirate etches a portion of the back side of the integrated circuit chip. From this etched portion, the pirate etches cavities having a width of a few micrometers, for example, by using an ion beam, which extend towards the front surface until the circuits have been reached. Electric contacts with circuit elements are then created in the cavities, and the pirate uses these contacts to analyze the integrated circuit chip in operation.

In another type of attack, the pirate scans the integrated circuit chip with laser pulses. The impact of the laser beam disturbs the integrated circuit chip operation. The observation of the consequences of such disturbances on the activity of the circuits enables the pirate to carry out the attack. To disturb the integrated circuit chip operation, the pirate may also apply positive or negative potentials by means of a probe in contact with the integrated circuit chip, or induce currents or voltages in elements of the circuits by means of a coil arranged close to the integrated circuit chip. This type of attack is called fault injection attack.

In another type of attack, the pirate uses the electromagnetic radiation emitted by the integrated circuit chip to obtain the confidential data. Indeed, the switching of the logic gates forming a circuit generates electromagnetic radiation. Now, in a circuit, not all logic gates switch at each clock cycle and, thus, the electromagnetic emissions will be proportional to the number of switching logic gates. Due to the use of certain mathematical analysis algorithms (Hamming distance, etc.), it is possible to find the integrated circuit chip ciphering key based on an analysis of the variations of the electromagnetic emissions of the circuit.

Known attack detectors all have one or a plurality of the following disadvantages. Some only enable to detect a limited number of attack types, often a single one. Some are visible for the pirate. The addition of certain detectors causes modifications in the manufacturing process.

SUMMARY

An embodiment overcomes all or part of the disadvantages of usual electronic integrated circuit chips protected against attacks.

Thus, an embodiment provides an integrated circuit chip stack comprising: a main integrated circuit chip containing components to be protected; and an auxiliary integrated circuit chip opposite each surface of the main integrated circuit chip, the area of each auxiliary integrated circuit chip opposite the components to be protected comprising a metal plane connected to ground, and at least one insulated conductive track forming a tight pattern opposite the components to be protected, the ends of said at least one conductive track being accessible at the level of the main integrated circuit chip.

According to an embodiment, the pattern formed by the conductive tracks is a coil.

According to an embodiment, the pattern formed by the conductive tracks is a spiral.

According to an embodiment, one end of a conductive track of an auxiliary integrated circuit chip is connected to an end of a conductive track of the other auxiliary integrated circuit chip.

According to an embodiment, the device is capable of detecting an interruption of the connection between conductive tracks.

According to an embodiment, the conductive tracks are connected to a device capable of detecting interruptions of the conductive tracks.

According to an embodiment, the auxiliary integrated circuit chips are affixed to the main integrated circuit chip by metal bumps.

According to an embodiment, the auxiliary integrated circuit chips comprise electronic components.

According to an embodiment, the metal plane of each auxiliary integrated circuit chip extends all over the surface of the corresponding auxiliary integrated circuit chip.

According to an embodiment, the dimensions of one of the auxiliary integrated circuit chips are smaller than those of the other auxiliary integrated circuit chip.

Another embodiment provides a method of protecting components of a main integrated circuit chip comprising the steps of: providing auxiliary integrated circuit chips each comprising a metal plane connected to ground, and at least one insulated conductive track forming a tight pattern; assembling the auxiliary integrated circuit chips on either side of the main integrated circuit chip so that the metal planes and the conductive tracks are opposite the components to be protected; connecting the ends of the conductive tracks to the main integrated circuit chip.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1:
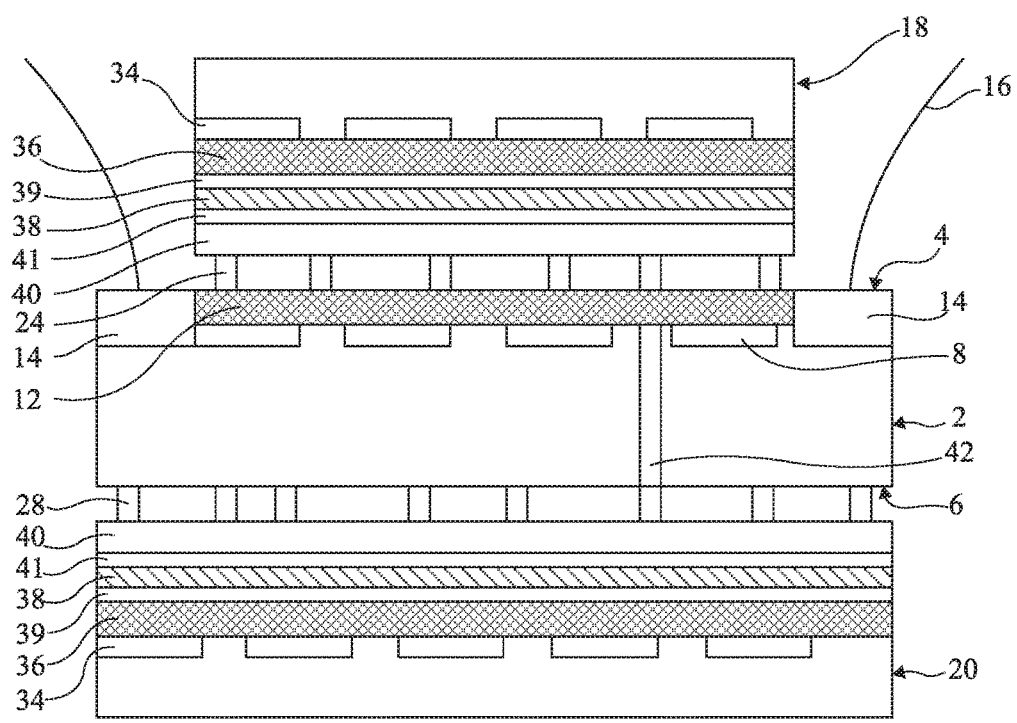
FIG. 1 is a simplified cross-section view of an embodiment of a stack of integrated circuit chips comprising a protected integrated circuit chip.

The same elements have been designated with the same reference numerals in the various drawings and, further, the various drawings are not to scale. For clarity, only those steps and elements which are useful to the understanding of the described embodiments have been shown and are detailed. In particular, the components of the different integrated circuit chips are not described in detail.

Unless otherwise specified, term "substantially" means to within 10%, preferably to within 5%.

Expression "interruption of a conductive track" should be understood as meaning either a total interruption of the track or a partial interruption, resulting in a modification of the track resistance.

FIG. 1 is a simplified cross-section view of an embodiment of a integrated circuit chip stack comprising a main integrated circuit chip 2. Main integrated circuit chip 2 has a first surface 4 and a second surface 6 that are opposed.

Main integrated circuit chip 2 comprises, on the side of first surface 4, electronic components 8 to be protected containing confidential data. The confidential data are for example bank data, personal data, or encryption keys.

Main integrated circuit chip 2 further comprises an interconnection network 12 covering components 8. Interconnection network 12 is formed of metallization levels, not shown, connected to one another and to components 8 of the integrated circuit chip, by conductive vias, not shown.

Main integrated circuit chip 2 further comprises contact pads 14 at the first surface 4. In FIG. 1, contact pads 14 are located at the periphery of integrated circuit chip 2 and are capable of being connected by conductive wires 16 to outer circuits, for example, voltage sources, clock signal sources, or input/output terminals.

Auxiliary integrated circuit chips 18 and 20 may each contain electronic components 34. Components 34 contain no confidential data and it is not necessary to protect them against pirate attacks. Each integrated circuit chip 18 or 20 then comprises an interconnection network 36 covering components 34 and interconnecting them.

Each interconnection network 36 is covered with an insulating layer 38 containing at least one conductive track, not shown in FIG. 1 extending opposite the components to be protected. Each network 36 is separated from the conductive track by an insulating layer 39. The conductive tracks will be described in further detail in relation with FIGS. 2 and 3.

The layer 38 of each integrated circuit chip 18 and 20 is covered with a metal plane 40, preferably connected to ground. Each metal plane 40 is separated from the associated layer 38 by an insulating layer 41. Each metal plane 40 extends at least on the area located opposite the components 8 to be protected. Each metal plane 40 for example extends over the entire integrated circuit chip 18 or 20.

Metal planes 40 are, for example, made of copper or of aluminum and have a thickness for example in the range from 1 to 5 μm.

Auxiliary integrated circuit chips 18 and 20 are located on each side of main integrated circuit chip 2. Integrated circuit chips 18 and 20 are located so that metal plane 40 of integrated circuit chip 18 is located opposite first surface 4 of integrated circuit chip 2 and that metal plane 40 of integrated circuit chip 20 is located opposite second surface 6 of integrated circuit chip 2. Integrated circuit chip 18 is affixed to integrated circuit chip 2 by metal elements 24 and integrated circuit chip 20 is affixed to integrated circuit chip 2 by metal elements 28.

Metal elements 24 and 28 are, for example, metal bumps connecting pads, not shown, of integrated circuit chips 18 and 20 to pads of integrated circuit chip 2. The height of elements 24 and 28, corresponding to the distance between integrated circuit chip 18 or integrated circuit chip 20 and integrated circuit chip 2, is for example in the range from 10 to 50 μm.

At least some of elements 24 are connected to interconnection network 12 of integrated circuit chip 2. Elements 24 may be connected to metal plane 40 of integrated circuit chip 18, to the conductive track(s) formed in layer 38 of integrated circuit chip 18 via insulated vias, not shown, crossing metal plane 40 of integrated circuit chip 18, or to interconnection network 36 of integrated circuit chip 18 via insulated vias, not shown, crossing metal plane 40 and layer 38 of integrated circuit chip 18.

At least some of elements 28 are connected to interconnection network 12 of integrated circuit chip 2 via vias 42 crossing integrated circuit chip 2 from second surface 6 all the way to network 12. Elements 28 may be connected to metal plane 40 of integrated circuit chip 20, to the conductive track(s) formed in layer 38 of integrated circuit chip 20 via insulated vias, not shown, crossing metal plane 40 of integrated circuit chip 20, or to interconnection network 36 of integrated circuit chip 20 via insulated vias, not shown, crossing metal plane 40 and layer 38 of integrated circuit chip 20.

For clarity, a single via 42 has been shown in FIG. 1. However, there may be as many vias as necessary.

Integrated circuit chip 18, in the example of FIG. 1, has dimensions smaller than the dimensions of integrated circuit chip 2 to allow the access to contact pads 14. The dimensions of integrated circuit chip 18 are however at least sufficient to cover all the components to be protected 8 and the interconnection network 12 connecting them.

Integrated circuit chip 20, in the example of FIG. 1, has dimensions substantially equal to those of integrated circuit chip 2. The dimensions of integrated circuit chip 20 may however be different from those of integrated circuit chip 2, while remaining sufficient to cover all the components 8 to be protected.

As a variation, not shown, it is possible for the connections made by conductive wires 16 to be achieved differently. For example, contact pads 14 may be located on the surface of integrated circuit chip 18 opposite to metal plane 40 and the connection with integrated circuit chip 2 may then be achieved via metal elements 24 and vias crossing integrated circuit chip 18 all the way to contact pads 14. Integrated circuit chip 18 may then have dimensions substantially equal to those of integrated circuit chip 2.

Figure 2:
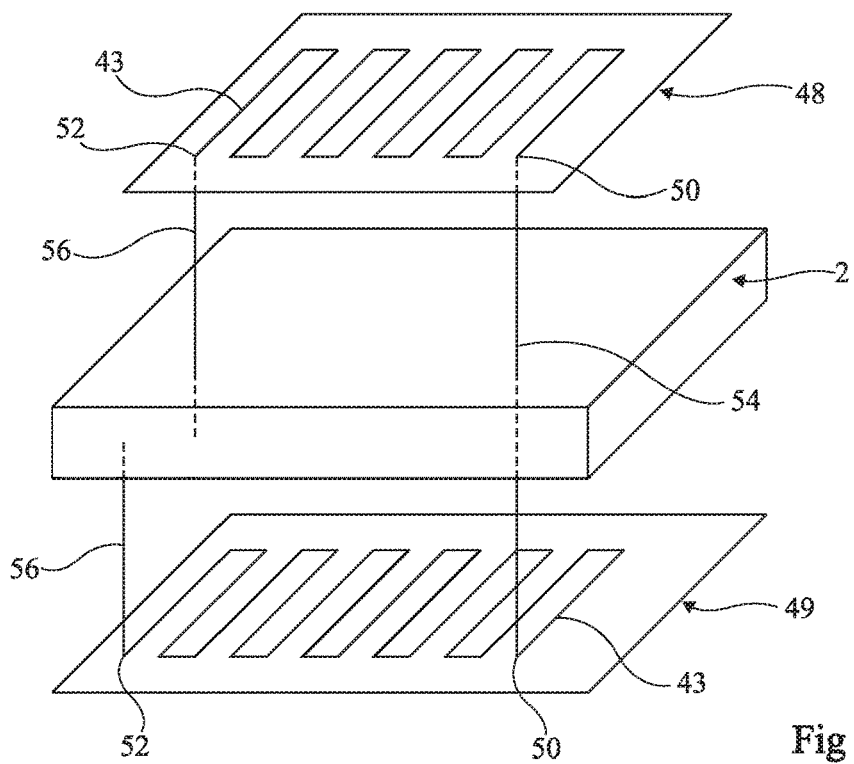
FIGS. 2 and 3 are simplified perspective views of embodiments of conductive tracks.

FIG. 2 is a simplified perspective view of the embodiment described in relation with FIG. 1 showing an example of a conductive track pattern. Integrated circuit chip 18 is here only shown as a plane 48 containing a conductive track 43. Similarly, integrated circuit chip 20 is only shown as a plane 49 containing a conductive track 43. Integrated circuit chip 2 is only shown as a parallelepiped.

In this example, the conductive track 43 of each layer 48 is coil-shaped and has ends 50 and 52. Ends 50 of the track are connected together by a connection 54. Connection 54 for example corresponds, in relation with FIG. 1, to an insulated via crossing metal plane 40 of integrated circuit chip 18, to a metal element 24, to interconnection network 12, to a via 42 crossing integrated circuit chip 2, to a metal element 28, and to another via crossing metal plane 40 of integrated circuit chip 20. Conductive tracks 43 and connection 54 thus form an electrically continuous path running from one end 52 to the other. Ends 52 of conductive tracks 43 are connected, by connections 56, to a device, not shown, capable of detecting the interruption of the electrically continuous path, that is, the total or partial interruption of one of conductive tracks 43 or the interruption of one of connections 54 or 56. The device is located among the components to be protected (8, FIG. 1) of integrated circuit chip 2. Thus, the device is protected from pirates who then cannot interfere with its operation, for example, by deactivating it.

The patterns of the conductive tracks are tight patterns, that is, the interval between two neighboring conductive track portions is relatively small. The selection of the dimensions of the tracks and of the interval separating neighboring track portions is done according to existing etch technologies, so that any attempt of attack by etching causes a total or partial interruption of a conductive track.

A step of detecting an interruption of conductive tracks 43 and of connection 54 may, for example, be carried out after a manual control, automatically at regular intervals or each time the integrated circuit chip is started, during the initialization.

Figure 3:
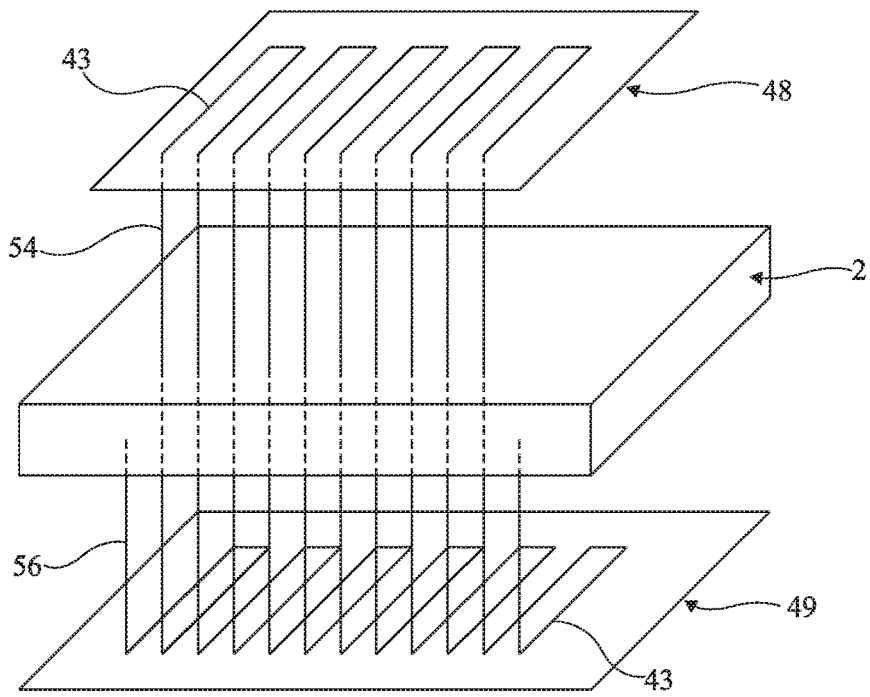

FIG. 3 is a simplified perspective view of an alternative embodiment. The drawing shows another example of a conductive track pattern. FIG. 3 comprises elements identical to elements of FIG. 2, designated with the same reference numerals. FIG. 3 shows an electrically continuous path starting from integrated circuit chip 2, where it is connected to a device, not shown, of detection of an interruption of the path. The path then alternates, via a connection 56 and connections 54, previously described, between conductive tracks 43 of integrated circuit chips 18 and 20 before joining integrated circuit chip 2 and the detection device via a connection 56.

As a variation, it is possible to form a plurality of different electrically continuous paths, each connected to a device capable of detecting the interruption of the path and located among the components to be protected 8 of integrated circuit chip 2. For example, it is possible to form a path running from integrated circuit chip 2 to layer 38 of integrated circuit chip 18, extending in layer 38 and joining integrated circuit chip 2, as well as a similar path for integrated circuit chip 20. Each of these paths enables to detect the piercing of the integrated circuit chip, 18 or 20, where it is formed, or its separation from integrated circuit chip 2. There then is no direct connection (for example, a connection 54) between the tracks of integrated circuit chip 18 and of integrated circuit chip 20.

Physical attacks such as the piercing of one of integrated circuit chips 18 or 20, for example, to place a contact at the level of the interconnection network, may reach components 34 and interconnection networks 36 of said integrated circuit chip 18 or 20. However, integrated circuit chips 18 and 20 do not contain confidential data. Such an attack targeting integrated circuit chip 2, which contains confidential data, causes a total or partial interruption of a conductive track of a layer 38 and is detected. The removal of one of integrated circuit chips 18 and 20 to have access to integrated circuit chip 2 causes the interruption of a connection 54 or 56 and the detection of the attack.

Laser attacks may, like physical attacks, reach integrated circuit chips 18 and 20. However, metal planes 40 stop the laser beam, which thus cannot reach integrated circuit chip 2. Auxiliary integrated circuit chips 18 and 20 may also comprise laser beam detectors, for example, photodiodes, to identify a laser beam attack. Auxiliary integrated circuit chips 18 and 20 may also comprise additional protection devices.

Metal planes 40, preferably connected to ground, form a Faraday cage around components 8. It is thus not possible for a pirate to analyze the electromagnetic emissions of integrated circuit chip 2.

An advantage of the previously-described embodiments is that integrated circuit chip 2, which is desired to be protected, is not modified by the protection devices.

As a variation, metal planes 40 and conductive tracks 43, as well as the insulating layers separating them, rather than being located, as in FIG. 1, in different integrated circuit chips 18 and 20 of the protected integrated circuit chip 2, may cover the first and second surfaces of integrated circuit chip 2, surrounding components 8.

An advantage of these embodiments is that the conductive track interruption detector is located among components 8 and is protected. It thus cannot be reached by the pirate.

Specific embodiments have been described. Various alterations, modifications, and improvements will occur to those skilled in the art. In particular, other patterns are possible for the conductive tracks 43 of layers 38. Conductive tracks 43 may for example take the shape of one or a plurality of spirals or the shape of lines. The patterns of the conductive tracks 43 of a integrated circuit chip 18 or 20 may extend over a plurality of levels.

Various embodiments with various variations have been described hereabove. It should be noted that those skilled in the art may combine various elements of these various embodiments and variations without showing any inventive step.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A stack of integrated circuit chips, comprising:
   a main integrated circuit chip containing circuit components to be protected from attack; and
   an auxiliary integrated circuit chip mounted opposite each of a front surface and a rear surface of the main integrated circuit chip, wherein an area of each auxiliary integrated circuit chip located opposite the circuit components to be protected from attack comprises a metal plane connected to ground, and
   each auxiliary integrated circuit chip further including at least one insulated conductive track forming a tight pattern opposite the components to be protected, wherein ends of said at least one conductive track are accessible at a level of the main integrated circuit chip.

2. The stack of integrated circuit chips of claim 1, wherein the tight pattern formed by the conductive tracks is a coil.

3. The stack of integrated circuit chips of claim 1, wherein the tight pattern formed by the conductive tracks is a spiral.

4. The stack of integrated circuit chips of claim 1, wherein an end of the at least one insulated conductive track of the auxiliary integrated circuit chip mounted opposite the front surface is electrically connected to an end of the at least one insulated conductive track of the auxiliary integrated circuit chip mounted opposite the rear surface.

5. The stack of integrated circuit chips of claim 4, further comprising a circuit device connected to the insulated conductive tracks and configured to detect interruptions of the insulated conductive tracks.

6. The stack of integrated circuit chips of claim 5, wherein the circuit device is configured to detect an interruption of the electrical connection between the insulated conductive tracks.

7. The stack of integrated circuit chips of claim 1, wherein the auxiliary integrated circuit chips are mounted to the main integrated circuit chip by metal bumps.

8. The stack of integrated circuit chips of claim 1, wherein the auxiliary integrated circuit chips comprise electronic components.

9. The stack of integrated circuit chips of claim 1, wherein the metal plane of each auxiliary integrated circuit chip extends over the entire surface of the corresponding auxiliary integrated circuit chip.

10. The stack of integrated circuit chips of claim 1, wherein the dimensions of at least one of the auxiliary integrated circuit chips are smaller than the dimensions of the main integrated circuit chip.

11. A method of protecting circuit components of a main integrated circuit chip, comprising the steps of:
   providing auxiliary integrated circuit chips each comprising a metal plane connected to ground and at least one insulated conductive track forming a tight pattern;
   assembling the auxiliary integrated circuit chips on either side of the main integrated circuit chip so that the metal planes and the conductive tracks are opposite the components to be protected; and
   connecting the ends of the conductive tracks to the main integrated circuit chip.

12. An integrated circuit chip stack, comprising:
   a main integrated circuit chip including a front surface and containing circuit components to be protected; and
   a first auxiliary integrated circuit chip mounted to the front surface, the first auxiliary integrated circuit chip including a layer with a metal plane connected to ground and a layer with a first insulated conductive track forming a tight pattern;
   wherein the main integrated circuit chip includes a circuit electrically connected to said first insulated conductive track and configured to detect a circuit interruption of the first insulated conductive track.

13. The integrated circuit chip stack of claim 12, wherein the tight pattern formed by the first insulated conductive track is at least a portion of a coil.

14. The integrated circuit chip stack of claim 12, wherein the tight pattern formed by the first insulated conductive tracks is at least a portion of a spiral.

15. The integrated circuit chip stack of claim 12, wherein the first auxiliary integrated circuit chip is mounted to the main integrated circuit chip by metal bumps.

16. The integrated circuit chip stack of claim 12, wherein the main integrated circuit chip includes a rear surface, further comprising:
   a second auxiliary integrated circuit chip mounted to the rear surface, the second auxiliary integrated circuit chip including a layer with a metal plane connected to ground and a layer with a second insulated conductive track forming a tight pattern;
   wherein the circuit of the main integrated circuit chip is electrically connected to said second insulated conductive track and configured to detect a circuit interruption of the second insulated conductive track.

17. The integrated circuit chip stack of claim 16, wherein the first insulated conductive track is connected to the second insulated conductive track.

* * * * *